United States Patent [19]

Whang

[11] Patent Number: 4,968,663

[45] Date of Patent: Nov. 6, 1990

[54] DUCTILE, SINGLE PHASE-CONTINUOUS SUPER-CONDUCTING OXIDE CONDUCTORS

[75] Inventor: Sung H. Whang, Huntington, N.Y.

[73] Assignee: Polytechnic University, Brooklyn, N.Y.

[21] Appl. No.: 316,292

[22] Filed: Feb. 27, 1989

[51] Int. Cl.$^5$ .............................................. H01B 13/00
[52] U.S. Cl. ...................................... 505/1; 148/20.3; 505/736
[58] Field of Search .................... 505/1, 704, 705, 733, 505/736; 148/20.3

[56] References Cited

U.S. PATENT DOCUMENTS

| 4,339,508 | 7/1989 | Tsuya et al. | 428/606 |
| 4,826,808 | 5/1989 | Yurek et al. | 148/430 |

FOREIGN PATENT DOCUMENTS

| 305300 | 3/1989 | European Pat. Off. | 505/736 |
| 63-257125 | 10/1988 | Japan | 505/736 |
| 63-313416 | 12/1988 | Japan | 505/736 |
| 64-17840 | 1/1989 | Japan | 505/736 |
| 8908155 | 9/1989 | PCT Int'l Appl. | |

OTHER PUBLICATIONS

Hsu et al., "Formation of Metal Superconducting Oxide Composites by Oxidation . . . ", IEEE Transactions on Magnetics, vol. 25, No. 2, Mar. 1989, pp. 2135–2137.
Zwicker et al., "Kupfer und Kupfer–Silber–Legierungen als Werkstoffe Zur . . . ", Metall, vol. 43, No. 1, Jan. 1989, pp. 18–21.
J. G. Bednorz and K. A. Muller, *Z. Phys.*, B64 189 (1986).
M. K. Wu et al., *Phys. Rev. Lett.*, 58(9), 908–910 (1987).
K. Kitazawa et al., *Jap. J. Appl. Phys. Lett.*, 26(4), L339–L341 (1987).
C. Michel et al., *z. Phys. B.*, 68, 421–423 (1987).
J. Aikimitsu et al., *Jap. J. Appl. Phys. Lett.*, 26, L2080–L2081 (1987).
H. Maeda et al., *Jap. J. Appl. Phys. Lett.*, 27, L209–L210 (1988).
M. A. Subramanian, *Science*, 239, 1015–1017 (1988).
M. Onoda et al., *Jap. J. App. Phys. Lett.*, 27(5), L833–L836 (1988).
S. A. Sunshine et al., *Phys. Rev. B.*, 38(1), 839–896 (1988).
J. M. Tarascon et al., *Phys. Rev. B.*, 37(16), 9382–9389 (1988).
Y. Syono et al., *Jap. J. Appl. Phys. Lett.*, 27(4), L569–L572 (1988).
Y. Matsui et al., *Jap. J. Phys. Lett.*, 27(3), L361–L364 (1988).
Y. Gao et al., *Science*, 241, 954–956 (1988).
R. Haldor et al., *Appl. Phys. Lett.*, 51, 538–539 (1987).
K. Matsuzaki et al., *Jap. J. Appl. Phys.* 26(4), L334–L336 (1987).
K. Matsuzaki et al., *Jap. J. Appl. Phys.* 26(8), L1310–1312 (1987).
S. H. Whang and Z. X. Li, *Modern Physics*, in press.
Y. Yamada et al., *Jap. J. Appl. Phys.*, 27(5), L802–L803 (1988).
K. Matsuzaki et al., *Jap. J. Appl. Phys.*, 27(2), L195–L198 (1988).
G. J. Yurek et al., *J. Elect. Soc.*, Accelerated Brief Communication, 2635–2636 (Oct. 1987).
K. Togano et al., "Structure and Superconducting Properties of High $T_c$ Oxide Superconductors Prepared by Liquid Quenching", Int'l Meeting on Advanced Materials, Sunshine City, Ikebukuro, Kokyo, Japan (May 30–Jun. 3, 1988).

(List continued on next page.)

*Primary Examiner*—Theodore Morris
*Assistant Examiner*—David W. Schumaker
*Attorney, Agent, or Firm*—Curtis, Morris & Safford

[57] ABSTRACT

Ductile, composite superconductors having a continuous Re-Ba-Cu-O type or Bi-Sr-Ca-Cu-O type phases and a continuous noble metal phase and a process for their preparation are disclosed.

43 Claims, 3 Drawing Sheets

OTHER PUBLICATIONS

G. J. Yurek et al., "Superconducting Microcomposites by Oxidation of Metallic Precursors", *J. Met.,* 16–18 (1988).

D. Wessel and D. Stipp, "MIT Team Develops Superconductors Using Metal Alloys Instead of Ceramics", *Wall Street Journal* (Jun. 11, 1987).

K. A. McDonald, "Scientific File Hundreds of Requests for Patents on New Superconductors", *The Chronicle of Higher Education, XXXV*(17) (Jan. 4, 1989).

Abstract (appearing in *J. Met.,* Nov. 1988) of paper to be presented at Feb. 27, 1989 Symposium, sponsored by the TMS Superconducting Materials committee, by K. H. Skin and S. H. Whang et al., entitled "Fabrication and Properties of Superconducting Yb-Ba-Cu-Ag-O Ribbon Prepared by Melt Spinning Technique".

Research Proposal of S. H. Whang submitted on Feb. 18, 1988 to the Naval Surface Weapon Center, Metallic Materials Branch, White Oak Laboratory, Silver Spring, Md.

(A) SILVER (B) OXIDE

DUCTILE, SINGLE PHASE-CONTINUOUS SUPER-CONDUCTING OXIDE CONDUCTORS

FIELD OF THE INVENTION

This invention relates to superconducting oxides. Several publications are referenced in this application by Arabic numerals within parentheses in order to more fully described the state of the art to which this invention pertains. Full citations for these references are found at the end of the specification immediately preceding the claims.

BACKGROUND OF THE INVENTION

Since high-temperature superconductivity with onset at 30° K. was discovered for a mixed structure in the La-Ba-Cu-O system (1), a great deal of effort has been devoted to the synthesis of a new oxide superconductor exhibiting a high critical temperature ($T_c$). Thus, high critical temperatures of 92° K. and 95° K. were recently obtained in oxide compounds based on the Y-Ba-Cu-O (2) and Yb-Ba-Cu-O (3) systems, respectively. The crystal structure of these compounds has been identified as that of oxygen deficient perovskite, tetragonal $K_2NiF_4$.

Subsequently, non-rare earth type superconducting oxides containing bismuth were discovered (4, 5, 6) and found to have superconducting dual phases which are responsible for a high $T_c$ of 105° K. and a low $T_c$ of 75° K., respectively. Initially, the crystal structure of these phases was reportedly indexed as an orthorhomic structure (pseudo tetragonal structure) in which lattice parameters a, b are very similar, i.e., a~b (7, 8, 9, 10). However, a high resolution electron microscopy study on the Bismuth oxides showed that the orthorhombic cell has a modulated structure along the a-axis which is five times the subcell size $b_{sc}$, i.e., b~$5b_{sc}$ and b=27 Å(11, 12, 13). All the observed lattice parameters are approximately within the range of a~5.41+0.015 Å, b~5.4+015 Å; c~30.8+0.1 Å.

The high $T_c$ associated with these oxides represents a potential for significant technological applications. High $T_c$ oxide superconductors have been prepared through many processes of blending, pressing and sintering and the shape is usually in bulk form. For many significant technological applications, it is desired to fabricate superconducting oxides in wire or filament form. However, processing and fabrication of superconducting oxides into desired forms such as wire and filament are accompanied by serious problems due to inherent material properties such as brittleness, anisotropy in current flow, weak link behavior caused by defect structures, etc. In an effort to alleviate these problems, diversified approaches to processing and fabrication have been explored.

One such approach is the "precursor alloy-oxidation route" in which precursor alloys containing the constituent elements, with the exception of oxygen, of the superconducting oxide are prepared by rapid solidification (14, 15, 16) or mechanical alloying (17, 18) followed by oxidation at high temperatures for a prolonged period of time in order to form the superconducting orthorhmobic perovskite structure. While the precursor alloys are homogeneous and often show amorphous structures, the resulting superconducting oxides are still inherently brittle and therefore not suited for fabrication into wire or filament.

In another approach, superconducting oxide powders are compacted into a metal tube, sealed under vacuum and then extruded into wires at high temperatures. However, the as-extruded wires are not superconducting because the powders have lost oxygen during the high temperature extrusion process. Therefore, oxygen must be replenished by annealing at intermediate temperatures so that the powders can regain superconductivity by absorption of oxygen which penetrates through the metal wall of the wire to the powders. However, the time required for oxygen to penetrate the metal wall of the wire to reach the powders is too long to be practical. Alternatively, the metal wall of the wire can be chemically etched to expose the powders and the wire is then immersed in an oxygen atmosphere. However, this alternative is too costly to be economically practical.

In still another process, the addition of up to 50 weight percent of silver (19) or gold (20) to the precursor alloys in rare earth metal systems and the addition of up to 60 weight percent of silver in the bismuth system (21) have improved ductility in the resultant superconducting oxides. Notwithstanding this improvement in ductility, only ribbons of limited length. A greater improvement in ductility is required to obtain longer ribbons and wires. However, in the rare earth metal system, it has been found that a composite formed by oxidation of a Eu-Ba-Cu precursor alloy containing 70 weight percent gold was not a superconductor because the oxide particles were too widely separated. In other words, the discontinuity of the oxide phase prevented superconductivity.

Thus, a significant advance in the art would be achieved by providing a composite simultaneously possessing the ductility required for practical applications (e.g. wire or ribbon of substantial length) and a continuous superconducting oxide phase required for superconductivity.

OBJECTS OF THE INVENTION

It is an object of the invention, therefore, to provide a composite, superconducting material having continuous, noble metal and oxide phases, having improved ductility and having a transition temperature of at least 77° K.

It is another object of the invention to provide a simple and economic process for preparing a superconducting composite having continuous noble metal and oxide phases, improved ductility and a transition temperature of at least 77° K.

These and other objects, features and advantages of the invention will become readily apparent from the ensuing description and the novel features will be particularly pointed out in the appended claims.

SUMMARY OF THE INVENTION

Ductile superconductors are desired for applications requiring ribbons or wires of substantial length and flexibility. In rare earth(Re)-Ba-Cu-O type superconducting oxides, some degree of ductility has been achieved by using a precursor alloy incorporating up to 50 atomic percent of a noble metal, rapidly solidifying the molten composite and then annealing in air to achieve the superconducting oxide. However, the resulting superconducting oxide composites still do not have the ductility required for wires or ribbons greater than one foot in length. While increasing the noble metal content of the precursor alloy achieves greater ductility, the resulting composite is not superconducting after conventional annealing procedures due to discontinuous superconducting oxide phases.

In contrast, the invention makes possible the production of composite superconductors having a noble metal content of greater than 50 atomic percent which has the degree of ductility required to produce flexible ribbons or wires of substantial length, advantageously greater than one foot in length, and which are superconducting by virtue of a continuous superconducting oxide phase. In accordance with the invention, the continuous superconducting oxide phase, which imparts the superconductivity to the composite, is made possible by using an inert gas atmosphere during preliminary annealing of the rapidly solidified precursor composite alloy. It is believed that the annealing process in accordance with the invention causes the superconducting oxide phase to migrate to the outer limits of the composite material to form a continuous superconducting oxide phase which encapsulates a continuous noble metal core. The inner core of noble metal affords the improved ductility of the composite superconductors of the invention.

Therefore, in one aspect, the invention is broadly directed to a process for preparing a ductile, composite superconductor which comprises the steps of forming a mixture having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and greater than about 50 atomic percent of a fourth constituent selected from the group consisting of noble metals, heating the mixture to form a molten alloy, rapidly solidifying the molten alloy and annealing the solidified alloy in an inert atmosphere followed by an oxygen containing atmosphere.

In another aspect, the invention is directed to a ductile, composite superconductor having a continuous noble metal phase, a continuous superconducting oxide phase and having an overall composition comprising about 0.8 to 3.3 atomic percent of a first constituent selected from the group consisting of rare earth metals, about 1.7 to 6.6 atomic percent of a second constituent selected from the group consisting of Group II substances, about 2.5 to 9.9 atomic percent of copper, about 5 to 30 atomic percent oxygen and greater than about 50 atomic percent of a fifth constituent selected from the group consisting of noble metals.

In yet another aspect, the invention is directed to a ductile, composite superconductor having a continuous noble metal phase and a continuous superconducting oxide phase, said superconductor having been prepared by a process comprising the steps of forming a mixture having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and greater than about 50 atomic percent of a fourth constituent selected from the group consisting of noble metals, heating the mixture to form a molten alloy, rapidly solidifying the molten alloy and annealing the solidified alloy in an inert atmosphere followed by an oxygen containing atmosphere.

In still another aspect, the invention is directed to an alloy having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and greater than about 50 atomic percent of a fourth constituent selected from the group consisting of noble metals.

In another aspect, the invention is directed to an alloy having been prepared by a process comprising the steps of forming a mixture having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and greater than about 50 atomic percent of a fourth constituent selected from the group consisting of noble metals, heating the mixture to form a molten alloy and rapidly solidifying the molten alloy.

In still another aspect, the invention is directed to a process for preparing a ductile, composite superconductor comprising the steps of forming a mixture having an overall composition of about 1 to 30 atomic percent of bismuth, about 2.0 to 35 atomic percent of a second constituent selected from the group consisting of Group II substances, about 1.5 to 30 atomic percent of copper and greater than about 60 atomic percent of a fourth constituent selected from the group consisting of noble metals, heating the mixture to form a molten alloy, rapidly solidifying the molten alloy and annealing the solidified alloy in an oxygen containing atmosphere.

In yet another aspect, the invention is directed to a ductile, composite superconductor having a continuous noble metal phase, a continuous superconducting oxide phase and having an overall composition comprising about 1 to 8 atomic percent of bismuth, about 1 to 14 atomic percent of a second constituent selected from the group consisting of Group II substances, about 1 to 8 atomic percent of copper, about 3 to 30 atomic percent oxygen and greater than about 60 atomic percent of a fifth constituent selected from the group consisting of noble metals.

In another aspect, the invention is directed to a ductile, composite superconductor having a continuous noble metal phase and a continuous superconducting oxide phase, said superconductor having been prepared by a process comprising the steps of forming a mixture having an overall composition comprising about 1 to 30 atomic percent of bismuth, about 2 to 35 atomic percent of a second constituent selected from the group consisting of Group II substances, about 1.5 to 30 atomic percent of copper and greater than about 60 atomic percent of a fourth constituent selected from the group consisting of noble metals, heating the mixture to form a molten alloy, rapidly solidifying the molten alloy and annealing the solidified alloy in an oxygen containing atmosphere.

In another aspect, the invention is directed to an alloy having an overall composition comprising about 1 to 30 atomic percent of bismuth, about 2 to 35 atomic percent of a second constituent selected from the group consisting of Group II substances, about 1.5 to 30 atomic percent of copper and greater than about 60 atomic percent of a fourth constituent selected from the group consisting of noble metals.

In yet another aspect, the invention is directed to an alloy having been prepared by a process comprising the steps of forming a mixture having an overall composition of about 1 to 30 atomic percent of bismuth, about 2 to 35 atomic percent of a second constituent selected from the group consisting of Group II substances, about 1.5 to 30 atomic percent of copper and greater than about 60 atomic percent of a fourth constituent selected from the group consisting of noble metals, heating the mixture to form a molten alloy and rapidly solidifying the molten alloy

BRIEF DESCRIPTION OF THE DRAWINGS

The invention, as well as various objects, features and advantages thereof, will be understood more clearly and fully from the following detailed description, when read with reference to the accompanying drawings in which.

DETAILED DESCRIPTION OF THE INVENTION

The continuous superconducting oxide phase of the composite superconductors prepared in accordance with one embodiment of the invention can be any Re-Ba-Cu-O type superconducting oxide having a critical temperature ($T_c$) of at least 30° K and advantageously at least 77° K. These include the so-called "1, 2, 3" superconducting oxides such as $La_1Sr_2Cu_3O_{7-x}$, $Yb_1Ba_2Cu_3O_{7-x}$, $Eu_1Ba_2Cu_3O_{7-x}$, and $Ho_1Ba_2Cu_3O_{7-x}$.

Thus, in accordance with the process of the invention, a "precursor" alloy is formed from a mixture having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and greater than about 50 atomic percent of a fourth constituent selected from the group consisting of noble metals.

Rare earth metals include elements in the Periodic Table with atomic numbers 57 through 71, advantageously lanthanum, ytterbium, europium, and holmium. The first constituent can be a single rare earth metal or a mixture of two or more rare earth metals.

Group II substances comprising the second constituent include beryllium, magnesium, calcium, strontium, barium and radium. Calcium, strontium and barium are advantageously used. The second constituent can be a single Group II substance or a mixture of two or more Group II substances. For example, the first constituent can be a mixture of calcium and strontium, calcium and barium, calcium, strontium and barium or strontium and barium. However, the second constituent is very advantageously barium alone.

The fourth constituent comprises greater than about 50 atomic percent of a noble metal. These are metals which are not readily oxidized, in particular, silver, gold, platinum and palladium. Silver, gold and platinum are advantageously used. The fourth constituent can be a single noble metal or a mixture of two or more noble metals. Advantageously, the fourth constituent is a single noble metal, for example, silver. The amount of noble metal is advantageously about 55 to 95 atomic percent, more advantageously about 60 to 95 atomic percent and most advantageously about 70 to 90 atomic percent. In a preferred embodiment, the amount of noble metal is about 90 atomic percent.

In one embodiment, a precursor alloy comprises about 6.7 atomic percent ytterbium, about 13.3 atomic percent barium, about 19.9 atomic percent copper and about 60 atomic percent silver. In another embodiment, a precursor alloy comprises about 1.6 atomic percent ytterbium, about 3.4 atomic percent barium, about 5 atomic percent copper and about 90 atomic percent silver.

The mixture of component elements of the precursor alloy are then heated to form a molten alloy. Advantageously, the molten alloy is homogeneous. The temperature used to form the molten alloy is higher than the melting point of the element having the highest melting point of all the elements in the mixture. Induction melting can be used to form the molten alloy. The heating is advantageously carried out in an inert atmosphere such as argon, helium or nitrogen. The component elements of the alloy can be melted and formed into an ingot which is then remelted to insure homogeneity of the molten alloy.

The molten alloy is then rapidly solidified. The term "rapidly solidified" as used herein means that the molten alloy is quenched at a rate such that it solidifies substantially instantaneously. Thus, the quench rate ranges from about $10^3$ degrees per second to about $10^7$ degrees per second, advantageously from about $10^4$ degrees per second to about $10^6$ per second. A quench rate of $10^5$ degrees per second is most advantageously used. Rapid solidification provides for the uniform dispersion of the noble metal through the other component materials. Rapid solidification can be achieved by a number of processing techniques well-known in the art, such as, for example, splat-quenching and melt-spinning. Each of these techniques involves withdrawing a small amount of the molten alloy and then instantaneously quenching the small amount so that it rapidly solidifies. For the preparation of precursor alloys in the form of ribbon or wire, melt-spinning is advantageously used. Rapid solidification is conducted in an inert atmosphere.

Thus, in accordance with one embodiment of the invention, the molten alloy is expressed from an orifice, usually in the bottom of a crucible, to form a molten stream of the alloy which is then immediately impinged onto a rotating chill surface which is moving at such a rate with respect to the expressed molten stream that the stream rapidly solidifies to form an alloy ribbon. Alloy ribbons produced in this manner have a thickness of about 2 to 100 μm and can be of unlimited length. Ribbons are advantageously prepared from homogeneous alloy buttons using a single roller melt spinner. The process is conducted in an inert atmosphere (e.g., argon, helium or nitrogen) in which the alloy button is melted in a crucible and the molten alloy is then expressed through an orifice in the crucible onto a rotating chill disk, e.g., a copper chill disk, with a circumferential speed of about 8 to 14 m/sec. The molten alloy is expressed at a pressure of about 5 to 20 psi onto the rotating disk at an angle of about 10° to 80°. One skilled in the art will readily appreciate that a variety of melt-spin processing parameters can be used depending on the size of the ribbon desired. Melt spun precusor alloy ribbons have a bend strain ductility of about 0.25 to 0.4.

If it is desired to form the precursor alloy into a wire, the molten alloy can be expressed from an orifice into a rotating chill drum which is moving at such a rate with respect to the expressed molten stream of alloy such that the stream rapidly solidifies to form a wire of about 100 to 300 μm in diameter and of unlimited length. The chill drum contains a cooling fluid such as water or a suitable hydrocarbon mixture.

The preformed, precursor alloy is then annealed in an inert atmosphere followed by an oxygen containing atmosphere. Annealing is carried out at a temperature and for a period of time sufficient to form a superconductor having a continuous noble metal phase and a continuous superconducting oxide phase. The resulting ductile, composite superconductor has a $T_c$ of at least about 30° K. and advantageously at least about 77° K. The inert atmosphere can be any gas which does not react with the alloy. Suitable gases include argon, helium and nitrogen. Argon is advantageously used. The chamber in which annealing takes place can be evacuated before annealing begins. Thus, the inert atmosphere can be maintained within the annealing chamber at pressures ranging from about $10^{-5}$ atmospheres to about 10 atmospheres, advantageously from about 0.5 atmospheres to about 2 atmospheres. More advantageously, the inert atmosphere maintained in the chamber is at about 1.1 atmospheres to about 1.5 atmospheres.

In one embodiment, the alloy is heated in the inert atmosphere over a period of about ten minutes to two hours to a temperature between about 300° C. and 1050° C. Once the temperature is reached, an oxygen containing atmosphere is introduced into the annealing chamber such that the total oxygen partial pressure is about 0.1 to 2 atmospheres, advantageously 0.1 to 1 atmosphere. A total oxygen partial pressure of 0.1 to 0.2 atmosphere is very advantageous. The oxygen containing atmosphere can be ambient air or pure oxygen. The oxygen containing atmosphere is maintained throughout the remainder of the annealing procedure. Upon introduction of the oxygen containing atmosphere into the annealing chamber, the temperature in the chamber is maintained for a period of about 1 to 50 hours, then cooled over a period of about 1 to 5 hours to a second temperature between about 500° C. and 700° C., maintained at the second temperature for a period of about 5 to 50 hours, cooled over a period of about 1 to 5 hours to a third temperature between about 300° C. and 500° C., maintained at the third temperature for a period of about 5 to 24 hours and finally cooled over a period of about 1 to 5 hours to room temperature.

In accordance with another embodiment of the invention, the continuous superconducting oxide phase of the composite superconductor can be any Bi-Sr-Ca-Cu-O type superconducting oxide having a $T_c$ of at least 30° K and advantageously at least 77° K. These include superconducting oxides such as $Bi_1Sr_1Ca_1Cu_2O_{6-x}$, $Bi_4Sr_3Ca_3Cu_4O_{15-x}$ and $Bi_4Sr_3Ca_3Cu_6O_{17-x}$.

Thus, in accordance with the process of the invention, a "precursor" alloy is formed from a mixture having an overall composition comprising about 1 to 30 atomic percent of bismuth, about 2 to 35 atomic percent of a second constituent selected from the group consisting of Group II substances, about 1.5 to 30 atomic percent of copper and greater than about 60 atomic percent of a fourth constituent selected from the group consisting of noble metals.

The Group II substances and noble metals are as described above. The amount of noble metal is advantageously about 65 to 95 atomic percent, more advantageously about 70 to 90 atomic percent. In a preferred embodiment, the amount of noble metal is about 90 atomic percent.

In an embodiment, a precursor alloy comprises about 2.8 atomic percent bismuth, about 2.1 atomic percent strontium, about 2.1 atomic percent calcium, about 2.8 atomic percent copper and about 90 atomic percent silver.

The mixture of component elements of the precursor alloy are then processed in substantially the same manner as that described with reference to the rare earth-based alloys described above to afford ductile, composite superconductors having a $T_c$ of at least 30° K., advantageously at least 70° K. In general, annealing is carried out at a temperature and for a period of time sufficient to form a superconductor having a continuous noble metal phase and a continuous superconducting oxide phase. In one embodiment, an alloy ribbon is heated in air at a rate of 10° C. per minute to a temperature of 850° C., held at that temperature for six hours and then cooled to room temperature at a rate of 5° C. per minute.

A better understanding of the present invention and of its many advantages will be had by referring to the following examples, given by way of illustration.

Example 1

A. Preparation of $(Bi_4Sr_3Ca_3Cu_4)_{10}Ag_{90}$ Precusor Alloy Ribbon

An alloy button was prepared by mixing 0.2873 g Bi, 0.0892 g Sr, 0.0408 g Ca, 0.0863 g Cu and 4.5 g Ag. The mixture was then melted in an arc furnace under argon atmosphere at a temperature of about 1100° C. Upon cooling, the resulting alloy button was turned over and remelted to ensure homogeneity.

Figure 1:
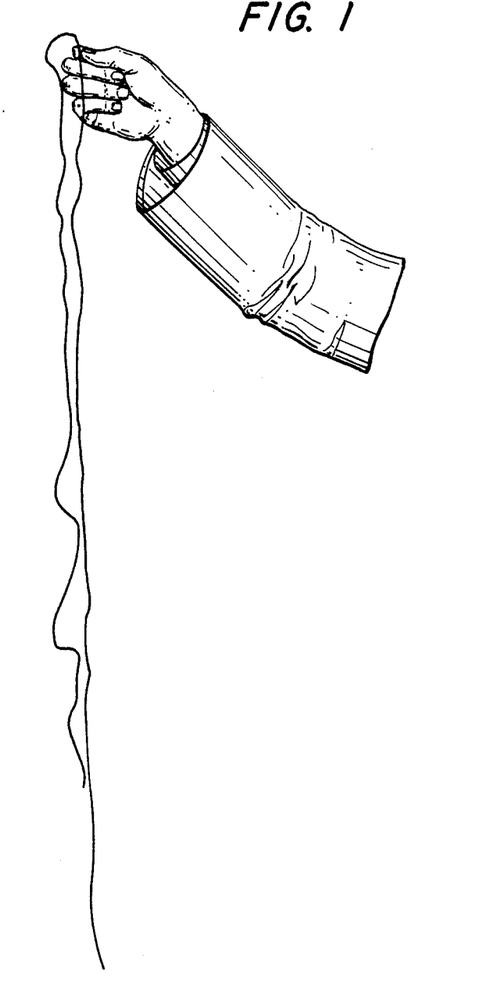
FIG. 1 depicts a $(Bi_4Sr_3Ca_3Cu_4)_{10}Ag_{90}$ precursor alloy ribbon of substantial length and flexibility.

The alloy button was then broken into a few pieces and charged into the quartz crucible of a melt-spinner apparatus. The quartz crucible had an internal diameter of 14 mm and an orifice of 0.7 mm in diameter. The alloy was induction melted under an atmosphere of argon at about 0.33 to 0.5 atmospheres. When the melt temperature reached about 1100° C., the quartz crucible was pressurized with argon and the melt expressed at a pressure of 5-8 psi through the orifice onto a spinning disk with a circumferential speed of 8 to 10 m/sec. The resulting ribbon, shown in FIG. 1, had a thickenss of 40-70 um and a width of 2-3 mm.

B. Annealing of the Precusor Ribbon

Figure 2:
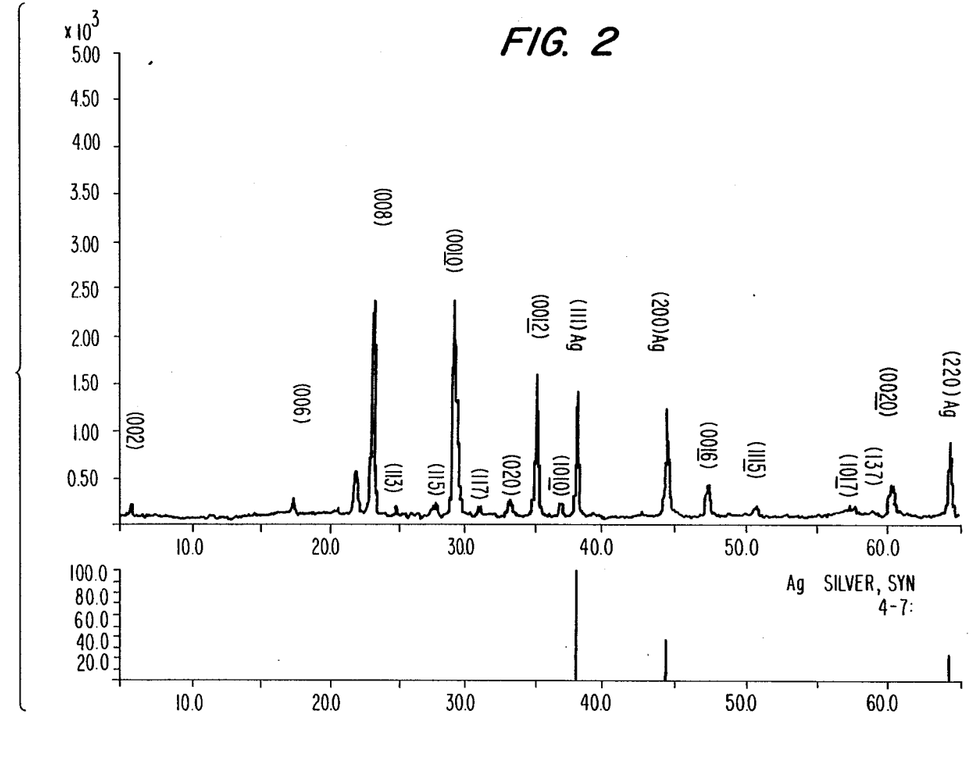
FIG. 2 is an X-ray diffraction pattern of the precursor alloy ribbon shown in FIG. 1 after annealing in air.

The precusor alloy ribbon was placed in a furnace and annealed in air by heating at a rate of 10° C. per minute to a temperature of about 850° C. This temperature was maintained for six hours. The alloy was then allowed to room temperature at a rate of 5° C. per minute. The X-ray diffraction pattern, shown in FIG. 2, indicates the presence of the superconducting orthorhombic crystal structure in the oxide phase.

EXAMPLE 2

Figure 3:
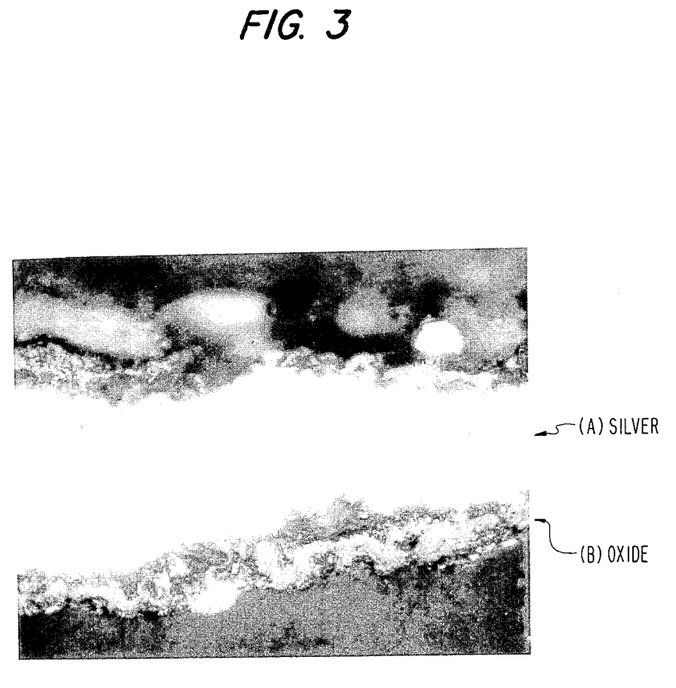
FIG. 3 is an optical micrograph of a section of $(Yb_1Ba_2Cu_3)_{10}Ag_{90}$ alloy ribbon after annealing in argon followed by oxygen.

A precursor alloy ribbon $(Yb_1Ba_2Cu_3)_{40}Ag_{60}$ was prepared in the manner described in Example 1A. The ribbon was then placed in a furnace and heated in an argon atmosphere to a temperature of about 860° C. When this temperature was reached, oxygen was pumped into the furnace and the temperature of 860° C. was maintained for about 20 hours. The alloy was then allowed to cool over a period of about 5 hours to 550° C., held at that temperature for about 11.5 hours, further allowed to cool over a period of about 5 hours to 300° C., held at that temperature for about 16.5 hours and then allowed to cool to room temperature. FIG. 3 is an optical micrograph of a section of the annealed alloy showing the separated silver (A) and oxide (B) phases. It is believed that the oxide phase is superconducting.

REFERENCES

1. J. G. Bednorz and K. A. Muller, Z. Phys., B64 189 (1986).
2. M. K. Wu et al., Phys. Rev. Lett., 58(9), 908–910 (1987).
3. K. Kitazawa et al., Jap. J. Appl. Phys., 26(4), 1339–1341 (1987).
4. C. Michel et al., Z. Phys., B68, 421 (1987).
5. J. Aikimitsu et al., Jap J. Appl. Phys., 26, L2080 (1987).
6. G. Maeda et al, Jap. J. Appl. Phys., 27, L209 (1988).
7. M. A. Subramanian, Science, 239, 1015 (1988).
8. M. Onada et al., Jap. J. App. Phys Lett., 27(5), L833–L836 (1988).
9. S. A. Sunshine et al., Phys. Rev. B., 38, 893 (1988).
10. J. M. Taraseon et al., Phys. Rev. B., 37, 9382 (1988).
11. Y. Syono et al., Jap. J. Appl. Phys. Lett., 27(4), L569 (1988).
12. Y. Matsui et al., Jap. J. Appl. Phys. Lett., 27(3), L361 (1988).
13. Y. Gao et al., Science, 241 (1988).
14. R. Haldor et al., Appl. Phys. Lett , 51, 538–539 (1987).
15. K. Matsuzaki et al., Jap. J. Appl. Phys., 26(4), L334–L336 (1987).
16. K. Matsuzaki et al., Jap. J. Appl. Phys., 26(8), L1310–L1312 (1987).
17. S. H. Whang and Z. X. Li, Modern Physics, in press
19. K.
18. Y. Yamada et al., Jap. J. Appl. Phys., 27(2), L195–L198 (b 1988). Matsuzaki et al., Jap J. Appl. Phys., 27(2), L195–L198 (1988).
20. G. S. Yurek et al., J. Elect. Soc., Accelerated Brief Communication, 2635–2636 (Oct. 1987).
21. K. Togano et al., "Structure And Superconducting Properties Of High $T_c$ Oxide Superconductors Prepared By Liquid Quenching", International Meeting On Advanced Materials, Sunshine City, Ikebukuro, Kokyo, Japan (May 30–June 3, 1988).

I claim:
1. A process for preparing a ductile, composite, superconductor comprising the steps of:
   (a) forming a mixture having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and greater than about 50 atomic percent of a fourth constituent selected from the group consisting of noble metals;
   (b) heating said mixture to form a molten alloy;
   (c) rapidly solidifying said molten alloy;
   (d) annealing said solidified alloy in an inert atmosphere followed by an oxygen containing atmosphere.

2. A process as recited in claim 2, wherein the amount of said fourth constituent is about 55 to 95 atomic percent.
3. A process as recited in claim 1, wherein said first constituent comprises more than one rare earth metal.
4. A process as recited in claim 1, wherein said second constituent comprises a mixture of more than one Group II substance.
5. A process as recited in claim 4, wherein said second constituent comprises a mixture of calcium and strontium, calcium and barium, calcium, strontium and barium or strontium and barium.
6. A process as recited in claim 1, wherein said fourth constituent comprises a mixture of more than one noble metal.
7. A process as recited in claim 1, wherein said fourth constituent is silver.
8. A process as recited in claim 6, wherein said mixture has an overall composition comprising about 1.6 atomic percent of ytterbium, about 3.4 atomic percent of barium, about 5 atomic percent of copper and about 90 atomic percent of silver.
9. A process as recited in claim 1, wherein said heating is performed in an inert atmosphere.
10. A process as recited in claim 9, wherein said inert atmosphere is argon, helium or nitrogen.
11. A process as recited in claim 1, wherein said heating step further comprises forming an alloy ingot and remelting said ingot.
12. A process as recited in claim 11, wherein said ingot is remelted by induction melting in an inert atmosphere.
13. A process as recited in claim 1, which further comprises withdrawing a small amount of said molten alloy and instantaneously quenching said small amount so that it rapidly solidifies.
14. A process as recited in claim 1, which further comprises expressing said molten alloy from an orifice and quenching said alloy by immediately impinging said expressed molten alloy onto a chill surface moving at a rate with respect to said expressed molten alloy such that it rapidly solidifies to form an alloy ribbon.
15. A process as recited in claim 1, which further comprises rapidly solidifying said molten alloy by expressing said alloy from an orifice into a rotating chill drum moving with respect to said expressed molten alloy such that it rapidly solidifies to form a wire.
16. A process as recited in claim 1, wherein said annealing step is conducted at a temperature and for a period of time sufficient to obtain a composite superconductor having a continuous noble metal phase and a continuous superconducting oxide phase.
17. A process as recited in claim 1, wherein said inert atmosphere is argon, helium or nitrogen.
18. A process as recited in claim 1, wherein said annealing step further comprises:
   (a) heating said solidified alloy in an inert atmosphere at a pressure of about $10^{-5}$ to 10 atmospheres over a period of about ten minutes to two hours to a first temperature between about 300° C. and 1050° C.;
   (b) introducing at said first temperature an oxygen containing atmosphere having a total oxygen partial pressure of about 0.1 to 2 atmospheres;
   (c) maintaining said first temperature for a period of about one to 50 hours;
   (d) cooling over a period of about one to five hours to a second temperature between about 500° C. and 700° C.;

(e) maintaining said second temperature for a period of about five to 50 hours;

(f) cooling over a period of about one to five hours to a third temperature between about 300° C. and 500° C.;

(g) maintaining said third temperature for a period of about five to 24 hours; and (h) cooling over a period of about one to five hours to room temperature.

19. A process as recited in claim 18, wherein said inert atmosphere is argon at a pressure of about 1.2 atmospheres.

20. A process as recited in claim 18, wherein said oxygen containing atmosphere is air.

21. A process as recited in claim 18, wherein said first, second and third temperatures are about 850° C., 650° C. and 350° C., respectively, and the period of time in steps (c), (e) and (g) is about 50 hours, 20 hours and 20 hours, respectively.

22. A process as recited in claim 1, wherein said annealing step further comprises:

(a) heating said solidified alloy in an oxygen containing atmosphere having a total oxygen partial pressure of about 0.1 to 2 atmospheres over a period of about ten minutes to two hours to a first temperature between about 300° C. and 1050° C.;

(b) maintaining said first temperature for a period of about one to six hours; and (c) cooling over a period of about one to five hours to room temperature.

23. A process as recited in claim 22, wherein said oxygen containing atmosphere is air.

24. A process as recited in claim 22, wherein said first temperature is about 850° C. and the period of time in steps (a), (b) and (c) is about 1.5 hours, 6 hours and 3 hours, respectively.

25. A process for preparing a ductile, composite superconductor having a continuous noble metal phase and a continuous superconducting oxide phase comprising the steps of:

(a) forming a mixture having an overall composition comprising about 1 to 16 atomic percent of a first constituent selected from the group consisting of rare earth metals, about 2 to 25 atomic percent of a second constituent selected from the group consisting of Group II substances, about 3 to 35 atomic percent of copper and about 55 to 95 atomic percent of a fourth constituent selected from the group consisting of noble metals;

(b) heating said mixture to form a molten alloy;

(c) rapidly solidifying said molten alloy by expressing said alloy from an orifice so that it immediately impinges onto a chill surface moving at a rate with respect to said expressed molten alloy such that it rapidly solidifies to form an alloy ribbon with a thickness of about 2 to 100 $\mu$m;

(d) heating said alloy ribbon in an inert atmosphere at a pressure of about $10^{-5}$ to 10 atmospheres over a period of about ten minutes to two hours to a first temperature between about 300° C. and 1050° C.;

(e) introducing at said first temperature an oxygen-containing atmosphere having a total oxygen partial pressure of about 0.1 to 2 atmospheres;

(f) maintaining said first temperature for a period of about one to fifty hours;

(g) cooling over a period of about one to five hours to a second temperature between about 500° C. and 700° C.;

(h) maintaining said second temperature for a period of about five to 50 hours;

(i) cooling over a period of about one to five hours to a third temperature between about 300° C. and 500° C.;

(j) maintaining said third temperature for a period of about five to 24 hours; and (k) cooling over a period of about one to five hours to room temperature.

26. A process as recited in claim 22, wherein said mixture has an overall composition comprising about 1.6 atomic percent of ytterbium, about 3.4 atomic percent of barium, about 5 atomic percent of copper and about 90 atomic percent of silver.

27. A process for preparing a ductile, continuous, composite superconducting oxide conductor comprising the steps of:

(a) forming a mixture having an overall composition comprising about 1 to 30 atomic percent of bismuth, about 2 to 35 atomic percent of second constituent selected from the group consisting of Group II substances, about 1.5 to 30 atomic percent of copper and greater than about 60 atomic percent of a fourth constituent selected from the group consisting of noble metals;

(b) heating said mixture to form a molten alloy, of about $10^3$ to $10^7$ degrees per second;

(c) rapidly solidifying said molten alloy; at a quench rate (d) annealing said solidified alloy in an oxygen containing atmosphere at a temperature and for a period of time sufficient to cause a superconducting oxide phase to migrate to outer surfaces of said composite, thereby forming a superconductor having a continuous noble metal phase and a continuous superconducting oxide phase.

28. A process as recited in claim 27, wherein the amount of said fourth constituent is between about 60 and 95 atomic percent.

29. A process as recited in claim 27, wherein said second constituent comprises a mixture of more than one Group II substance.

30. A process as recited in claim 27, wherein said second constituent comprises a mixture of calcium and strontium, calcium and barium, calcium, strontium and barium or strontium and barium.

31. A process as recited in claim 30, wherein said second constituent is a mixture of strontium and calcium.

32. A process as recited in claim 27, wherein said fourth constituent comprises a mixture of more than one noble metal.

33. A process as recited in claim 27, wherein said fourth constituent is silver.

34. A process as recited in claim 33, wherein said mixture has an overall composition comprising about 2.8 atomic percent of bismuth, about 2.1 atomic percent of strontium, about 2.1 atomic percent of calcium, about 2.8 atomic percent of copper and about 90 atomic percent of silver.

35. A process as recited in claim 27, wherein said heating is performed in an inert atmosphere.

36. A process as recited in claim 35, wherein said inert atmosphere is argon, helium or nitrogen.

37. A process as recited in claim 27, wherein said heating step further comprises forming an alloy ingot and remelting said ingot.

38. A process as recited in claim 37, wherein said ingot is remelted by induction melting in an inert atmosphere.

39. A process as recited in claim 27, which further comprises withdrawing a small amount of said molten alloy and instantaneously quenching said small amount so that it rapidly solidifies.

40. A process as recited in claim 27, which further comprises expressing said molten alloy from an orifice and quenching said alloy by immediately impinging said expressed molten alloy onto a chill surface moving at a rate with respect to said expressed molten alloy such that it rapidly solidifies to form an alloy ribbon.

41. A process as recited in claim 27, which further comprises rapidly solidifying said homogeneous, molten alloy by expressing said alloy from an orifice into a rotating chill drum moving with respect to said expressed molten alloy such that it rapidly solidifies to form a wire.

42. A process for preparing a ductile, composite superconductor having a continuous noble metal phase and a continuous superconducting oxide phase comprising the steps of:
  (a) forming a mixture having an overall composition comprising about 1 to 30 atomic percent of bismuth, about 2 to 35 atomic percent of a second constituent selected from the group consisting of Group II substances, about 1.5 to 30 atomic percent of copper and about 65 to 95 atomic percent of a fourth constituent selected from the group consisting of noble metals;
  (b) heating said mixture to form a molten alloy;
  (c) rapidly solidifying said molten alloy at a quench rate of about $10^3$ to $10^7$ degrees per second by expressing said alloy from an orifice so that it immediately impinges onto a chill surface moving at a rate with respect to said expressed molten alloy such that it rapidly solidifies to form an alloy ribbon with a thickness of about 2 to 100 $\mu$m;
  (d) heating said alloy ribbon in an oxygen containing inert atmosphere having a total oxygen partial pressure of about 0.1 to 2 atmospheres over a period of about ten minutes to two hours to a first temperature between about 300° C. and 1050° C.;
  (e) maintaining said first temperature for a period of about one to six hours; and
  (f) cooling over a period of about one to five hours to room temperature thereby causing a superconducting oxide phase to migrate to outer surfaces of said composite and thereby forming a composite superconductor having a continuous noble metal phase and a continuous superconducting oxide phase.

43. A process as recited in claim 42, wherein said mixture has an overall composition comprising about 2.8 atomic percent of bismuth, about 2.1 atomic percent of strontium, about 2.1 atomic percent of calcium, about 2.8 atomic percent of copper and about 90 atomic percent of silver.

* * * * *

UNITED STATES PATENT AND TRADEMARK OFFICE
CERTIFICATE OF CORRECTION

PATENT NO. : 4,968,663
DATED : November 6, 1990
INVENTOR(S) : Sung H. Whang

It is certified that error appears in the above-identified patent and that said Letters Patent is hereby corrected as shown below:

Claim 27, line 15, column 12, line 29, after "rate" insert --of about $10^3$ to $10^7$ degrees per second--.

Signed and Sealed this

Eighth Day of September, 1992

Attest:

DOUGLAS B. COMER

*Attesting Officer*     *Acting Commissioner of Patents and Trademarks*